United States Patent [19]

Morgan et al.

[11] Patent Number: 4,547,028
[45] Date of Patent: Oct. 15, 1985

[54] LOW PROFILE TEST CLIP

[75] Inventors: Thomas E. Morgan, Stow, Ohio; John Tengler, Chico, Calif.

[73] Assignee: A P Products Incorporated, Mentor, Ohio

[21] Appl. No.: 539,121

[22] Filed: Oct. 5, 1983

[51] Int. Cl.[4] ............................................. H01R 23/66
[52] U.S. Cl. ..................... 339/14 R; 29/758; 339/17 CF; 339/176 MF; 339/200 P; 339/218 M
[58] Field of Search .............. 339/17 CF, 17 F, 61 R, 339/61 M, 74 R, 99 R, 108 R, 110 R, 176 MF, 176 MP, 200 P, 218 R, 218 M, 255 P, 261; 81/428 R; 29/758

[56] References Cited

U.S. PATENT DOCUMENTS

| | | | |
|---|---|---|---|
| 2,103,891 | 12/1937 | Brown | 339/108 R |
| 2,699,534 | 1/1955 | Klostermann | 339/176 MP |
| 3,015,877 | 1/1962 | Francis | 339/218 R |
| 3,169,816 | 2/1965 | Hammond et al. | 339/110 R |
| 3,399,377 | 8/1968 | Warzecka | 339/176 MP |
| 3,605,060 | 9/1971 | Praeger | 339/17 F |
| 3,914,007 | 10/1975 | Seidler | 339/255 P |
| 4,190,311 | 2/1980 | Basta | 339/75 MP |
| 4,269,462 | 5/1981 | Bethurum | 339/200 P |
| 4,282,783 | 8/1981 | Fortune | 81/428 R |
| 4,326,764 | 4/1982 | Asick et al. | 339/176 MF |
| 4,431,248 | 2/1984 | Huntley et al. | 339/99 R |
| 4,474,418 | 10/1984 | Yamada | 339/176 M |

FOREIGN PATENT DOCUMENTS

| | | | |
|---|---|---|---|
| 2147377 | 3/1973 | Fed. Rep. of Germany . | |
| 1291006 | 3/1962 | France | 339/176 MP |
| 52-48092 | 4/1977 | Japan | 339/176 MF |
| 1246101 | 9/1971 | United Kingdom . | |

Primary Examiner—Neil Abrams
Attorney, Agent, or Firm—Maky, Renner, Otto & Boisselle

[57] ABSTRACT

The present invention is an electrical clip-like connector that has a low profile and is capable of connecting the conductors of an electrical cable, for example, with the leads of an integrated circuit package or the like. Due to the low profile configuration of the invention, it may be used in situ in confined environments, and it also may be used for coupling relatively high speed signals without or with minimum antenna effect. Other features of the invention include a locating mechanism that facilitates applying the clip connector to an integrated circuit assuring proper alignment of the contacts and leads and a preferred contact/support arrangement to help assure good electrical connection with the integrated circuit leads and tolerance for size and location errors while avoiding overstress damage to the contacts. Still other features of the invention include the close packing of the contacts thereof preferably in dual-in-line opposed contact pair arrangement, for example without having to spread the conductors of a ribbon cable connected thereto, the ability to ground or otherwise to connect in common certain ones of such conductors and/or contacts, and a resilient pivot mechanism for the connector body portions, which also preferably relies on the characteristics of the electrical cable to which the body portions are connected (preferably by direct molding thereto) to stabilize and to strengthen the connection between such body portions. The invention also includes a handle to install and to remove the clip-like connector with respect to an integrated circuit package or the like.

31 Claims, 13 Drawing Figures

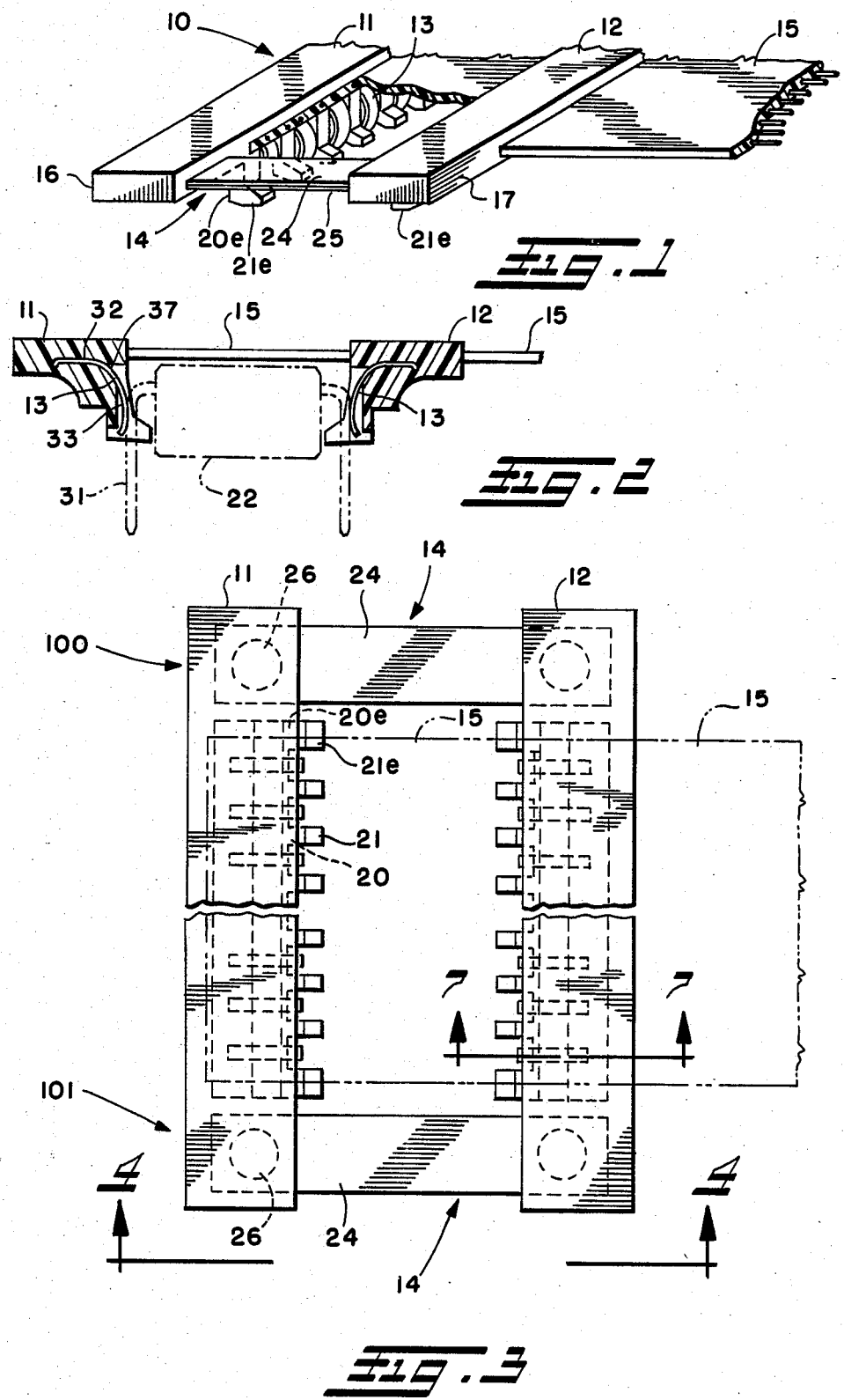

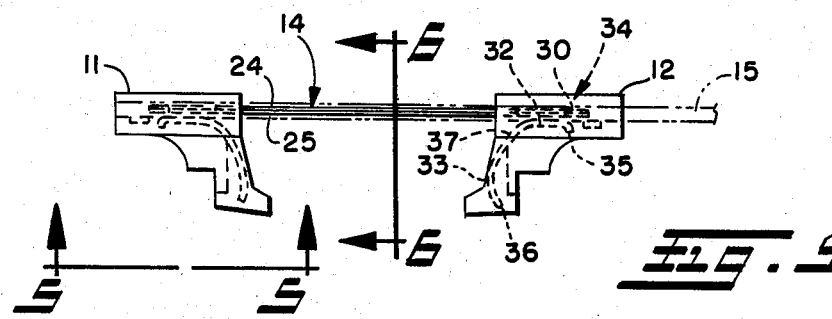
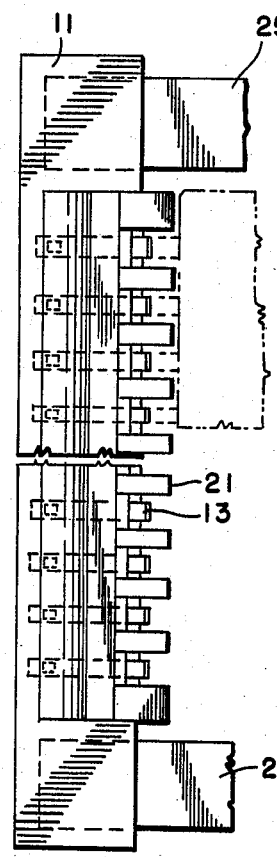
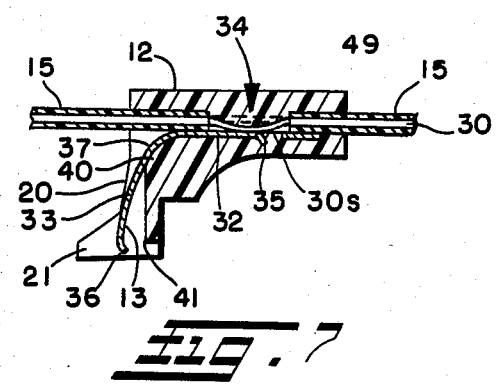
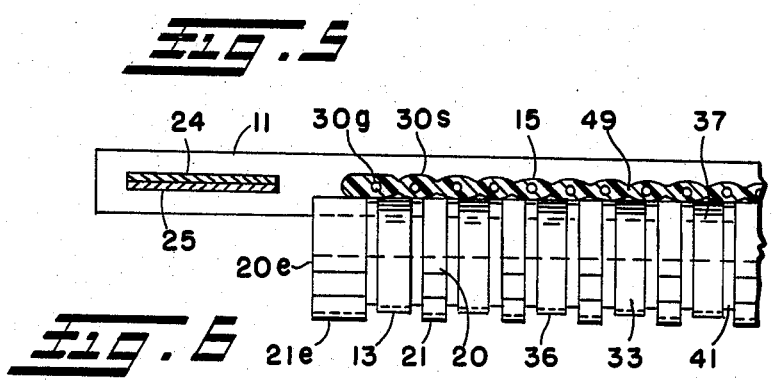

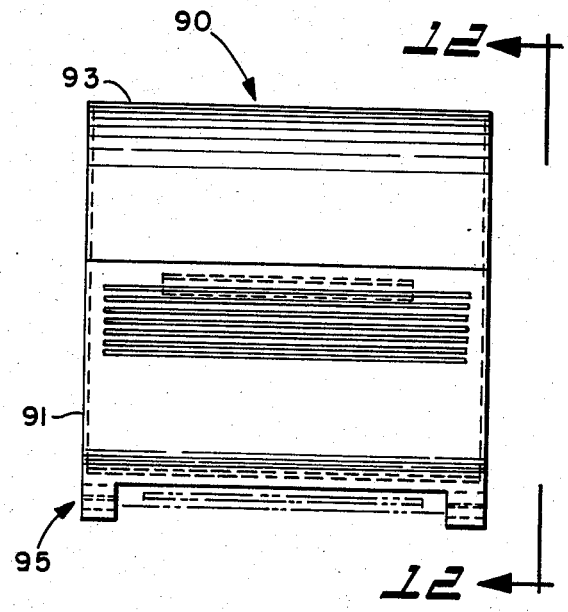
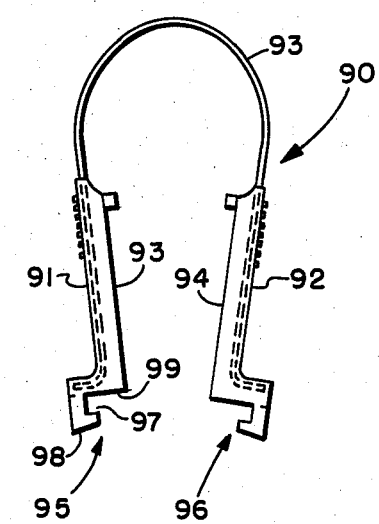
Fig. 11     Fig. 12
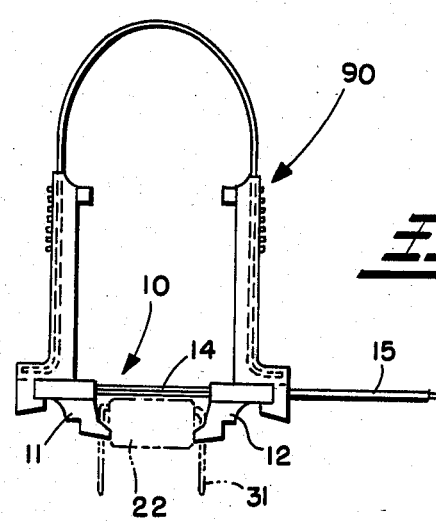
Fig. 13
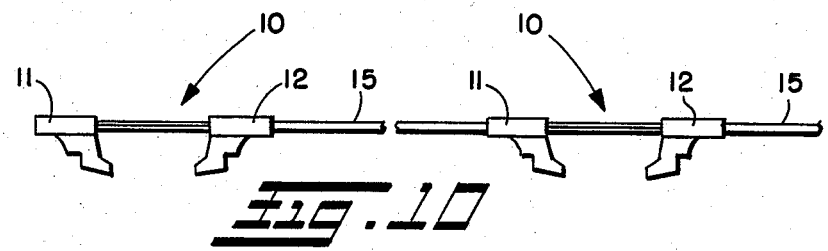
Fig. 10

LOW PROFILE TEST CLIP

This invention relates generally, as indicated, to test clips for electrical and electronic components, and, more particularly, to such test clips that have a low profile to facilitate placement in close quarters and to minimize antenna effect. The invention has particular, though not exclusive, application for interconnection with the input/output leads of an electrical component or device, such as an integrated circuit, for the purpose of attaching test equipment to the leads of a dual-in-line (or other lead configuration) package having multiple, say 14, 16, 32, 40, etc., leads. However, the invention lends itself for use with any number and/or arrangement of leads in other electrical and/or electronic packages. Moreover, the invention may be used for purposes other than testing, such as signal injecting, signal reading, circuit and/or device connecting, and like purposes.

An example of a prior test clip is one that has a pair of finger members or bodies that are pivotable with respect to each other and are connectable to an integrated circuit package while extending primarily in a direction perpendicular to or out of the major planar extent of the integrated circuit package. Each such finger member or body carries plural electrical contacts or conductors, which also extend generally in parallel with the integrated circuit leads relatively far out of the major planar, say of the top, extent of the integrated circuit package, that are intended to connect with the integrated circuit leads at one end of the finger members or bodies and that extend far enough away from such leads to facilitate connection to other external electrical devices, equipment, probes, etc. Heretofore, such test clips and other electrical connectors used for such testing and other purposes with respect to integrated circuits, for example, have been relatively large or bulky. Although such test clips have been quite satisfactory for use during the breadboarding of a circuit in the circuit design process and during testing of integrated circuits mounted on printed circuit boards which are conveniently mounted on a test bench or in a relatively spacious electrical or electronic device, they are not suitable for in situ connecting with integrated circuits located in rather confined areas.

Due to the relatively extended length of the conductors/contacts of such prior test clips, the same tend to produce an antenna effect. Therefore, use of such test clips for testing high speed signals, such as those with which transmission line type cable often is required, may be unsatisfactory due to the encountered and/or produced electrically noisy environment.

During the installing of an integrated circuit test clip on an integrated circuit package, a frequently encountered problem is the misalignment of the respective contacts of the test clip relative to the integrated circuit leads. Such misalignment may cause damage to such leads and/or the integrated circuit package, spurious test results, and, in the event that signals are injected into the integrated circuit via the test clip, possible damage to the integrated circuit due to incorrect signal input, short circuiting, etc.

The present invention is an electrical clip-like connector that has a low profile and is capable of connecting the conductors of an electrical cable, for example, with the leads of an integrated circuit package or the like. Due to the low profile configuration of the invention, it may be used in situ in confined environments, and it also may be used for coupling relatively high speed signals without or with minimum antenna effect. Other features of the invention include a locating mechanism that facilitates applying the clip connector to an integrated circuit, for example, assuring proper alignment of the contacts and leads and a preferred contact/support arrangement to help assure good electrical connection with the integrated circuit leads and tolerance for size and location errors while avoiding overstress damage to the contacts. Still other features of the invention include the ability to pack closely the contacts thereof preferably in dual-in-line opposed contact pair arrangement, for example to the same extent that the conductors of a ribbon cable are relatively positioned, the ability to ground or otherwise to connect in common certain ones of such conductors and/or contacts, and a resilient connection mechanism for the connector body portions, which also preferably relies on the characteristics of the electrical cable to which the body portions are connected (preferably by direct molding thereto) to stabilize and to strengthen the connection between such body portions and permits relative movement thereof to install or to remove the clip-like connector relative to, for example, an integrated circuit device or the like. Even other features will become more apparent as the following description proceeds. The invention also includes a handle to install and to remove the clip-like connector with respect to an integrated circuit package or the like.

According to one aspect of the invention, a low profile clip connector for electrical devices that have plural rows of electrically conductive leads includes a pair of clip bodies, each including a plurality of electrical contacts and an electrically non-conductive support, an electrical cable having therein a plurality of electrical conductors, a plurality of the electrical contacts being electrically connected to respective electrical conductors at respective junctions thereof, the supports being molded to the cable and contacts to enclose the respective junctions while leaving respective contacting portions of the contacts exposed for connection to respective leads of such an electrical device, and a coupling mechanism for coupling the pair of clip bodies with respect to each other in positions to enable the contacts to connect with respective leads of such an electrical device.

According to another aspect, the invention relates to a low profile electrical clip connector, including an electrical cable, having a plurality of electrical conductors, a pair of clip bodies molded to the cable, each body including plural electrical contacts having exposed contacting portions for engaging leads of an electrical device and a mounting portion molded in the body, respective mounting portions being electrically connected to respective conductors of the cable, and electrically non-conductive separator walls between respective pairs of relatively adjacent contacts, and a coupling mechanism for coupling the pair of bodies with respect to each other for mounting of the clip connector of an electrical device with respective electrical contacts engaged with respective leads of such device.

An additional aspect relates to a low profile clip connector for integrated circuits and the like, including a plurality of electrically conductive contacts, an electrically non-conductive holder support body for holding the contacts in relative positions with respect to each other, the holder support body having curved wall surfaces for supporting the contacts for bending relative to such wall surfaces without overstressing of the contacts, and a back-up wall surface for limiting the maximum bending of the contacts to prevent such overstressing, each of the contacts including a mounting portion secured relative to the holder support body, a curved intermediate portion positioned in generally overlying relation with respect to the curved wall surface, and a contacting portion resiliently extending from the curved intermediate portion away from the back-up wall surface in position to connect with a contact placed to engagement therewith and to deflect resiliently toward the back-up wall surface upon such engagement.

According to a further aspect, a handle is provided for manipulating a low profile clip-like connector for integrated circuits and the like. The connector includes a pair of electrically non-conductive support bodies mounted with respect to each other for relative pivoting, each support body carrying plural electrical contacts. The handle manipulates such connector with respect to such an integrated circuit or the like to place such contacts into or to remove such contacts from engagement with leads of such entegrated circuit or the like, and includes a pair of handle bodies, each including a gripping jaw for gripping a respective support body to form a relatively rigid extension thereof and a force applying arm for receiving force applied thereto to pivot respective pairs of a gripping jaw and a support body with respect to the relative mounting of such support bodies, and a connecting device for connecting the handle bodies together while permitting coupling of the handle bodies to respective support bodies and relative movement of the latter in response to such force being applied to the arms.

In the following description the invention will be referred to as a test clip, for according to the preferred embodiment and best mode of the invention, such device is intended for use to test the operability of and the functions of an integrated circuit device and other devices to which such integrated circuit device may be connected. However, it will be appreciated that the invention, including the various one or more features thereof, may be used with devices other than integrated circuits and for electrical connection purposes that are other than testing purposes. References to integrated circuit and to integrated circuit package are equivalently used and are intended to be exemplary only of a device to which the test clip of the invention may be connected; preferably such device has plural, e.g. dual-in-line lead configuration to which the test clip contacts conveniently may be connected. Reference to lead herein, though, generally may be construed as a reference to an electrically conductive member, such as a lead or contact associated with a dual-in-line package (DIP) electronic device or other electrical or electronic device to which the test clip of the invention may be connected. Additionally, references to electrical and to electronic may be used equivalently herein.

The above and other objects, features and advantages of the present invention will become more apparent from the description below and the accompanying drawings.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, this being indicative, however, of but one of the various ways in which the principles of the invention may be employed.

In the annexed drawings:

FIG. 1 is a partial isometric view, partly broken away in section, of a low profile test clip in accordance with the invention;

FIG. 2 is a side elevation section view of the test clip of FIG. 1;

FIG. 3 is a top plan view of the test clip of FIG. 1;

FIG. 4 is a side elevation view of the test clip looking generally in the direction of the arrows 4—4 of FIG. 3;

FIG. 5 is a partial bottom plan view of the test clip looking generally in the direction of the arrows 5—5 of FIG. 4;

FIG. 6 is a partial elevation/section view of the test clip looking generally in the direction of the arrows 6—6 of FIG. 4;

FIG. 7 is an enlarged section view of one of the body portions of the test clip and of the electrical cable molded directly therein looking generally in the direction of the arros 7—7 of FIG. 4;

FIG. 10 is a schematic view showing plural test clips on a single cable;

FIG. 11 is a front elevation view of a handle for installing and removing the test clip with respect to an integrated circuit package or the like;

FIG. 12 is a side elevation view of the handle looking generally in the direction of the arrows 12—12 of FIG. 11; and FIG. 13 is a side elevation view of the handle installed on a test clip according to the invention in turn installed on an integrated circuit package.

Figure 8:
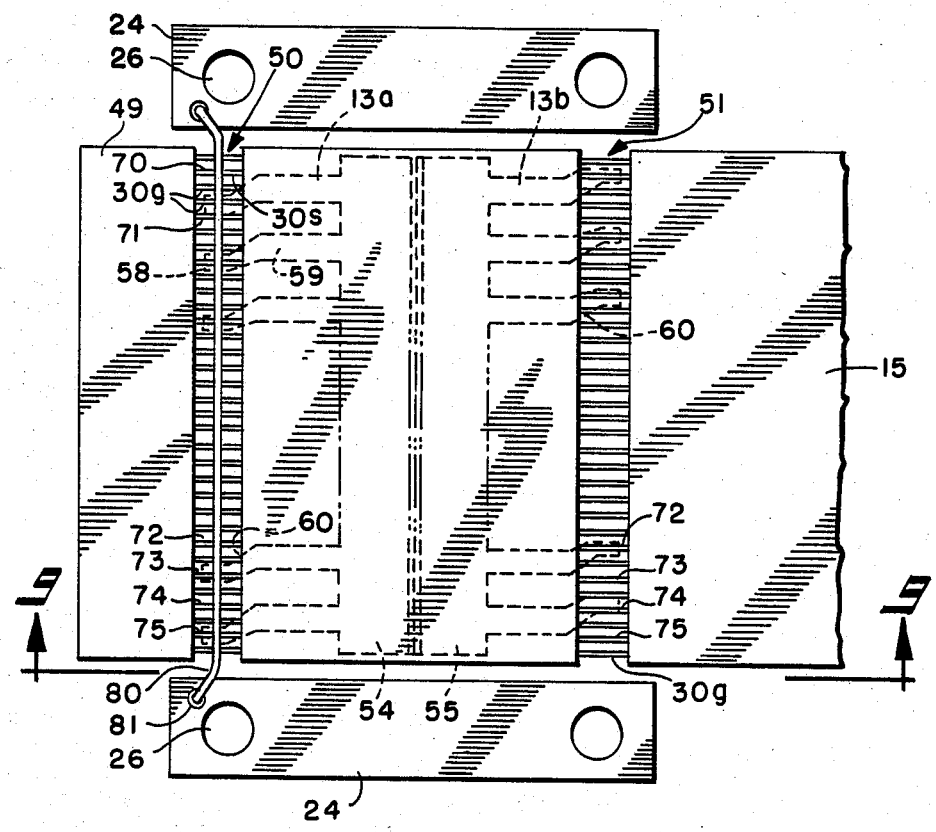
FIG. 8 is a top plan view of the incompletely formed contacts, electrical cable, resilient body connectors, and ground bus ready for molding with respect thereto of the test clip body portions.

Referring, now, in detail to the drawings, wherein like reference numerals identify like parts in the several figures, and initially to FIG. 1, a low profile test clip in accordance with the invention is designated 10. The test clip 10 includes a pair of electrically non-conductive body portions 11, 12, a plurality of electrically conductive contacts 13, a connector mechanism 14 for connecting the respective body portions with respect to each other, and a part of an electrical cable 15 to which the body portions are directly molded, as will be described in greater detail below. Preferably the contacts 13 are able to be so closely packed that connections thereof to the cable conductors, such as those of flat ribbon cable, will not require any spreading of the cable conductors; yet the test clip still will fit properly and conveniently onto an integrated circuit package or the like to engage electrically the respective leads thereof.

The body portions 11, 12 preferably are identical. Each includes an upper body 16, 17 into which mounting portions of the contacts 13, part of the connector mechanism 14, and part of the cable 15 are molded to form a secure, strong integral structure thereof; and the height of such upper body portions preferably is adequate to provide a strong interconnection and support/holding of such other parts while such height is otherwise preferably minimized to minimize the height profile of the test clip 10. Each body portion 11, 12 also includes a plurality of finger or wall-like separators 20 which are integrally molded with the respective upper bodies and function both to separate respective relatively adjacent contacts 13, preferably also to protect the contacts from various damage, to guide the test clip 10 into proper position with respect to the leads of an integrated circuit package, and to hold the test clip on such package. For such purposes, and especially the latter two, jaw-like teeth 21 protrude from the bottom of each separator 20. In FIG. 2, the gripping function that such teeth may provide with respect to an integrated circuit package 22 is shown. Moreover, in FIG. 3, the relative orientation of the teeth 21 for separating and positioning purposes is shown. Preferably the separators 20e and teeth 21e at the respective lateral ends of the group thereof associated with a given body portion 11, 12, i.e. most proximate the lateral ends 11e, 12e thereof, are wider in the lateral direction than are the other separators and teeth therebetween. Such wider members 20e, 21e are too wide to be inserted between a pair of leads 23 of the integrated circuit package 22 and, therefore, prevent the test clip 10 from being positioned in what might otherwise feel and even visually appear to be proper position but actually is a misaligned position with respect to such leads. The other separators 20 and feet 21 are of a narrower width so as to fit in the space between adjacent leads of an integrated circuit.

As is seen in FIG. 2, the overall height of the test clip 10 is nearly equivalent to the height of the integrated circuit package 22. The ability to achieve such low profile configuration is facilitated by a number of features of the test clip 10. For example, the space required for connecting the contacts 13 and conductors 23 of the cable 15 is minimized because of the contact shape, the direct metal to metal connection between the contacts and conductors via generally parallel portions of each without requiring insulation displacement/piercing by the contacts, and the molding of the test clip body portions 11, 12 directly to the cable, conductors thereof, and contacts. Further facilitating such low profile configuration are the separating and gripping functions of the separators 20 and teeth 21 and the connector mechanism 14. Preferably there is clearance between the cable 15 and the top of the integrated circuit package 22 for cooling and electrical isolation purposes, if desired.

The coupling or connector mechanism 14 provides both the means to hold the body portions 11, 12 in position relative to each other and to enable relative pivoting, folding out or rotational type of movement of such body portions, for example as the connector mechanism is flexed or otherwise preferably resiliently deformed. Such flexure tends to move the teeth 21 of one body portion 11 away from the teeth 21 of the other body portion to open the space therebetween and between respectively opposed contacts 13 carried by the respective body portions 11, 12 to facilitate inserting or installing the test clip 10 onto an integrated circuit package 22, for example, as is shown in FIG. 2; such flexure also facilitates removing the test clip 10 from an integrated circuit package. Moreover, the connector mechanism 14 preferably is resilient so that after such flexure, the body portions 11, 12 will be moved back into the relative positions to each other illustrated in FIGS. 1 and 2 under the influence of the connector mechanism.

After being installed on an integrated circuit package 22, as is shown in FIG. 2, the test clip 10 securely holds to such package. The resilient urging of the connector mechanism 14 causes the contacts 13 and preferably the teeth 21 to engage, respectively, the leads and body of the integrated circuit package to effect such holding function. According to the preferred embodiment and best mode of the invention, the connector mechanism 14 is comprised of two pairs of metal, e.g. spring steel, springs 24, 25, which operate as stacked leaf springs, one pair at each lateral end of the test clip 10. Each of the leaf springs 24, 25 has openings 26 at the opposite ends thereof to enable material of the respective body portions 11, 12 to be molded therethrough securing the springs thereto. A leaf spring arrangement provides firm relative positioning of the respective body portions 11, 12 and yet provides the desired resiliency, both while minimizing the amount, such as thickness and width, of material and stiffness of the individual leaves of the composite leaf spring required. Therefore, using leaf springs 24, 25 in the connector mechanism 14 further is conducive to the low profile configuration of the test clip 10. It will be appreciated that other connector mechanisms 14 may be used in accordance with the invention preferably to provide the desired relative movement of the body portions 11, 12 for installing and removing the test clip with respect to an integrated circuit package 22 or other device and preferably also for resiliently holding the test clip to such device.

In the preferred embodiment and best mode of the invention, the leaf springs 24, 25 of the connector mechanism 14 are in or approximately in the plane of the cable 15. This still further contributes to the ability to minimize the profile height of the test clip 10. Such minimum height tends to reduce antenna effect. However, if desired, the height of the upper bodies 16, 17 may be raised slightly to accomodate a sheet-like metal spring totally across the top of the cable 15 between the body portions 12, 13 or below the cable between the cable and the integrated circuit package, for example, thus providing a shielding function and further minimizing undesirable antenna effect.

The contacts 13, are intended to be relatively compliant to accomodate effective electrical connections with leads of integrated circuits or other devices in which the actual lead positions are not always located according to specification. As is seen in FIGS. 1 through 7, the contacts are of a configuration that provides a multiplicity of functions. Importantly, each contact 13 is intended to provide an electrical connection between a respective conductor 30 of the cable 15 and a respective lead 31 of the integrated circuit package 22, For this purpose, each contact 13 has a mounting portion 32 and a contacting portion 33 for respectively connecting electrically with such conductor 30 and lead 31. The cable 15 is secured in the body portions 11, 12 to extend generally parallel to a printed circuit board or the like onto which the integrated circuit package 22 may be mounted, thereby minimizing the space required for the cable, especially by avoiding any need to bend or to twist the cable when bringing it out from the test clip 10 and integrated circuit 22. This arrangement minimizes space requirements for the test clip 10 and cable 15 and also minimizes potential damage to the cable and/or other components while further minimizing possible antenna effect due to a distorted cable.

To enable such cable 15 to be brought out in parallel to such a prined circuit board, while minimizing the height of the body portions 11, 12, the mounting portion 32 of each contact 13 extends in a generally parallel direction with the conductors 30 and cable. Each mounting portion is connected at a junction 34 to a respective conductor 30 by soldered connection thereto. At the end of the contact mounting portion is a downwardly turned or bent tab 35, the purpose of which is to help secure or anchor the contact in the molded material of the respective body portion 11, 12.

The contacting portion 33 of each contact 13 preferably is smoothly curved or bowed over the major extent thereof to facilitate smooth sliding, wiping and bending thereof with respect to a lead 31 as the test clip 10 is installed or removed with respect to an integrated circuit package 22. Such bending preferably ordinarily would be within the resilient limits or elastic limits of the contacting portion 33 to avoid overstressing the contact to an undesirable permanent shape, such as one that would not assure the desired wiping and resilient engagement with a lead 22. Preferably each contacting portion 33 is recessed below the height of each of the relatively adjacent separators 20 to protect the contacting portions from external stresses, contamination, and the like before and during installation on an integrated circuit 22; in FIG. 1 the curvature of the contacting portions 33 is emphasized for facility of illustration. At the remote end of the contacting portion 33 is an inwardly, i.e. toward the center of the radius of curvature of the contacting portion, bent tab 36. The tab 36 functions to avoid a sharp end at the end of the contacting portion which could damage a lead 22 or a user of the test clip 10. The tab 36 also protects the contact 13 itself by preventing the end of the contacting portion from biting into a lead and becoming lodged therein so as to cause a permanent bending distortion of the contact 13 on continued application of force thereto during installation on an integrated circuit package 22.

A curved intermediate portion 37 of each contat 13 joins the mounting portion 32 and the contacting portion 33. The intermediate portion 37 maintains the continuity of curvature of the contacting portion 33, while providing a smooth transition to the mounting portion, which extends generally perpendicularly with respect to the major directional extent of the contacting portion and in any event generally in parallel with the conductors 30 and cable 15. Moreover, importantly the curved intermediate portion cooperates with a curved wall surface 40 of the body portion 11 or 12 between relatively adjacent pairs of separators to allow bending of the contact 13 minimizing stress concentrations and preventing overstressing thereof. The wall surface 40 is curved to an extent that permits relatively free bending of the contact 13 contacting portion 33 and, particularly, the intermediate portion 37 during normal installation and removal of the test clip 10 relative to an integrated circuit package 22 without overstressing the contacts beyond their elastic limit. The body portions also have back-up wall surfaces 41 extending from and located below the curved wall surfaces 40, recessed relative to the separators 20, and positioned behind the respective contacting portions 33 of the contacts to limit the maximum bending of the contacts to prevent possible overstressing during use, including the aforesaid installation and/or removal. The permissible bending of the contacts 13 and the limiting of such bending by the walls 40, 41 provides a relatively high degree of contact compliance. The radius or curved wall 40 allows a relatively large deflection of the contact 13 for maximum movement of the contacting portion 33 toward or away from a lead 31, for example, before the contacting portion bottoms out against the wall 41.

Referring particularly to FIG. 7, the cable 15 preferably is a flat ribbon type cable having plural electrical conductors 30 arranged in parallel positional relation and held so and in electrical isolation by the cable insulation 49. According to the preferred embodiment and best mode of the present invention, such cable 15 is that known as transmission line cable intended for high speed signal transmission; and in such case each signal conductor $30s$ is bounded on both sides thereof by respective ground conductors $30g$. Other types of flat ribbon cable or other cable also may be used, though.

To form a junction connection 34 between a respective conductor, such as one of the signal conductors $30s$, and the mounting portion 32 of a contact 13, a portion of the insulation 49 is removed at an area 50 or 51 of the cable to expose the conductors, and the particular conductor intended for such connection is deformed slightly downwardly out of the major planar, linear or axial extent of the cable and conductors therein, for example, as is shown at the deformed conductor portion $30d$. The junction connection 34 is completed by soldering together the deformed conductor portion $30d$ and the contact mounting portion 32, thereby forming a secure mechanical and electrical connection thereof. Therefore, those conductors 30 that are to be connected to respective contacts 13 carried in the body portion 11 are bent or deformed down at the area 50 of the cable where the body portion 11 is to be molded to form such respective junction connections 34; and for those conductors 30 intended to form junctions with contacts 13 carried in the body portion 12, they are so deformed at the area 51 of the cable 15 where the body portion 12 is to be molded. In this manner relatively close packing of the contacts and the conductors can be accomplished, and the contact spacing can be such that will conform to the spacing of the leads of the integrated circuit package 22, as will be described further below. Those conductors 30, such as ground conductors $30g$, which are not to be connected to a respective contact at one of the body portions 11, 12 are not so downwardly deformed and, therefore, are maintained out of connection with respective contacts.

After the respective junctions 34 have been so formed between respective contacts and conductors, the respective body portions 11, 12 are molded directly to and about such junctions, part of the cable insulation 49 and exposed conductors at such areas 50, 51 of the cable where the insulation had been removed, and part of the contacts 13. The body portions 11, 12 form an hermetic seal about the junctions to prevent air and moisture from reaching the same and causing any corrosive or electrolytic action that could reduce the efficiency of the electrical connection thereof. The cable, junctions and contacts, then, become an integral part of the body portion, thus forming a strong mechanical structure with high electrical connection and insulation integrity. In one embodiment, during such molding the insulation of the cable may form a chemical bond with the molding material, preferably of plastic or plastic-like material, of the body portion for strain relief. However, due to the deformation of the conductors, the mechanical connection thereof to respective contacts, and the molding of the body portions about such deformed conductors and such junctions, effective strain relief also is achieved thereby.

Figure 9:
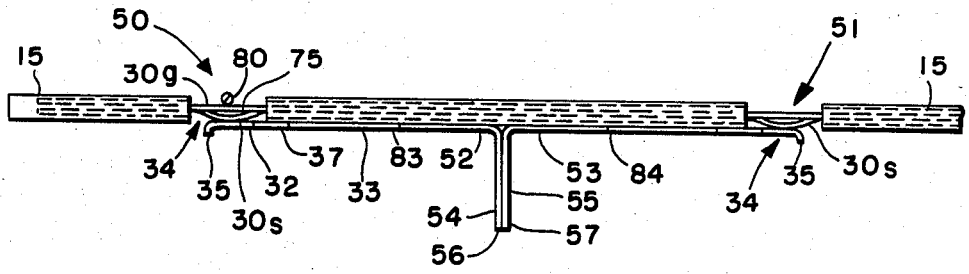
FIG. 9 is an end elevation view looking generally in the direction of the arrows 9—9 of FIG. 8.

Turning now to FIGS. 8 and 9, parts of the low profile test clip 10 are shown in position relative to each other ready for molding thereabout the respective body portions 11, 12. At areas 50, 51 insulation 49 has been removed to expose the parallel conductors 30 in the cable 15. Such conductors include ground conductors 30g and signal conductors 30s. At the upper portion of FIG. 8 the preferred form of the cable conductor structure is illustrated; such conductor configuration includes a ground conductor 30g at the edge of the cable, a signal conductor 30s adjacent and parallel to such ground conductor, a pair of ground conductors 30g parallel to and spaced away from the first-mentioned signal conductor, the next signal conductor, etc., whereby a separate pair of ground conductors is provided for each signal conductor in the cable. At the lower two-thirds of the cable shown in FIG. 8, only a single ground conductor is shown between adjacent signal conductors in order to avoid cluttering the drawing, but it will be appreciated that such illustrated single ground conductors may represent a pair thereof in the fashion shown on the upper portion of FIG. 8. It will be appreciated, though, that other conductor and cable configurations may be employed in accordance with the present invention.

As is seen in FIGS. 8 and 9, the contacts 13 are formed by cutting the same, for example die cutting, from one of two sheets of material 52, 53, whereby respective pluralities of contacts 13 are supported by respective carrier strips 54, 55. The sheets 52, 53 also preferably are bent to form the tabs 35 and respective handles 56, 57, which facilitate proper placement of the contacts 13 relative to the conductors 30 during the soldering operation to form the junctions 34 and during the molding operation to form the body portions 11, 12. Each of the contacts 13 has a connecting end 58 forming at least part of the mounting portion 32. The connecting end and the other parts of the contact 13 may be of the same or different lateral widths, relatively the same being preferred. However, in the illustrated embodiment the connecting end 58 is of smaller width than other portions of the contact to facilitate close packing without short circuits relative to the conductors 30. Each contact 13, then, is shown with a relatively wider portion 59 (FIG. 8) to maximize the surface area of the intermediate portion 37 and contacting portion 33 for strength, durability, compliance and available area for engagement with a lead 31 of an integrated circuit 22. The connecting end 58 is offset from the contacting portion 59 to expose an edge surface 60 of the contact essentially out of the plane (as it is seen in FIG. 8) beyond the edge of portion 59, and such edge surface 60 has a vector component that faces the direction of and opposes forces that would tend to pull the contact, say in either direction approximately parallel to the direction of the cable 15, from the molded body portion. Thus, the edge surface 60 may be cooperative with the molded material of a body portion 11, 12 further to enhance strain relief for the contact 13 and for the junction 34 of the contact and conductor with respect to a given body portion 11, 12.

Preferably the sheets 52, 53 are identical, but being used in paired opposition with the handles 56, 57 abutting each other, the connecting ends 58 of the sheets 54, 55 effectively are displaced, respectively, in opposite directions. Therefore, an opposite pair of contacts, such as those identified 13a, 13b, of respective sheets 52, 53 are in parallel opposed alignment with each other for engaging the paired opposed parallel leads 31 on opposite sides of an integrated circuit package 22 while the respective connecting ends 58 of such paired opposite contacts 13a, 13b are offset to form electrical junctions 34 with relatively adjacent signal conductors 30s. Thus, for example, the signal conductor 30s, which also is identified by the reference numeral 70, is aligned for electrical connection with the contact 13b; such conductor 70 also continues to pass through the cable, e.g. to the left hand direction as is seen in FIG. 8, but does not align with the connecting end 58 of the contact 13a. However, the signal conductor 30s identified by reference numeral 71, which is the next signal conductor adjacent the one identified by reference numeral 70, passes through the cable for alignment with the connecting end of the contact 13a but without engaging the connecting end 58 of the contact 13b, and so on. Other signal conductors 72 throught 75 are similarly represented in FIG. 8 aligned for connection with respective contacts 13 carried by the respective carrier strips 54, 55.

Those conductors 30 which are intended to form junctions 34 with the narrow connecting ends 58 of respective contacts 13 are deformed downward out of the major planar or axial extent of the conductors, for example, as is seen at conductors 74 and 75 in FIG. 9. To facilitate forming soldered connections at such junctions 34, the connecting ends 58 may have a coating of solder already placed thereon prior to assembly in the manner shown in FIGS. 8 and 9. After such assembly, heat, hot vapor, or other means may be employed to re-flow such solder to form soldered connections of respective contacts and conductors at junctions 34.

It will be appreciated that the described narrowing of the contact ends 58, the off-setting thereof, and the conductor deformation to form respective junctions especially facilitates close packing of the contacts 13 in the test clip 10 while desired electrical isolation requirements are maintained.

If desired, all or selected ones of the ground conductors 30g may be electrically connected in common using a wire 80 as a grounding bus therefor. Such wire 80 is adjacent the cable area 50 intended for enclosure in the body portion 11, and at such area it will be necessary to deform out of the plane of the wire bus 80 all of the signal conductors to avoid short circuiting thereof to ground. However, due to the offset configuration of the narrow connecting ends 58 of the contacts 13, the downward deforming of those signal conductors which are not intended to be connected to contacts supported on the carrier strip 54 will not engage such contacts thereby maintaining desired electrical isolation. (The molded body portion about the junctions 34, contact mounting portions 32 and conductors 30 also helps maintain such isolation.) If desired, the ground conductors 30g may be deformed upwardly out of the major plane or axial extent thereof to engage the ground bus wire 80 in further isolation from all of the signal conductors 30s. The ground bus wire 80 may be pre-coated with solder that may be reflowed using conventional techniques, such as heat, vapor, etc., to form soldered connections with the respective ground conductors 30g. Additionally, the connector mechanism 14, specifically the individual leaf springs 24, 25 thereof, also may be mechanically and electrically attached to the wire bus 80, for example by connecting the wire through holes in such springs, as is shown at 81, 82 in FIG. 8, thus further enhancing the overall ground plane isolation, noise shielding and antenna effect minimization characteristics of the test clip 10.

After the parts illustrated in FIGS. 8 and 9 have been assembled in the manner illustrated therein and described above, the body portions 11, 12 may be directly molded thereto. The body portions preferably are of electrically non-conductive plastic or plastic-like material and are molded using a plastic injection molding process. Such body portions form hermetic seals about the respective junctions 34, preferably integrally bond to the cable insulation 50, and position the respective wall surfaces 40, 41 relative to the exposed portions of the contacts 13, such as the contacting portion 33 and intermediate portion 37 thereof while the mounting portion 32 of each contact is secured in the molded body portion. After such molding, the handles 56, 57 of the respective contact carrier strips 54, 55 may be bent in a downward rotating fashion to bend the contact intermediate and contacting portions to the shape illustrated generally in FIGS. 1, 2, 4, and 7. The carriers 54, 55 then may be broken away or off from the contacts 13 at a break-away line 83, 84, which may be scored into the surface of the sheets 52, 53 during the formation thereof, thereby simultaneously forming the tabs 36 and electrically separating the individual contacts 13 from each other. The actual shapes of the wall surfaces 40, 41, and the manner in which the bending forces are applied to the contacts via the carrier strips 54, 55 will determine the shapes or curvatures of the contact intermediate and contacting portions 37, 33. Preferably such portions are curved in the manner shown. However, it may be the case that the contacting portion has more a linear extent than a curved one, and this configuration may be acceptable as long as the overall formation is such that the test clip can be inserted and removed with respect to the leads of an integrated circuit package making good electrical connection with such leads without damaging the same or the contacts (tabs 36 help avoid the possibility of such damage).

It will be appreciated that the test clip 10 may be located at or near an end portion of the cable 15 or at a portion of the cable intermediate the ends thereof. The remainder of the cable may be a "brought out" to another device for electrical connection thereto, such as a test device, signal injector, etc. Moreover, one or more test clips 10 may be formed on a single cable 15 at respective axial positions therealong to effect an interconnection via the cable of a plurality of integrated circuits or the like, whereby such test clips and cable also may form a parallel bus or daisy chain type device. Such an arrangement is shown in FIG. 10.

Referring to FIGS. 11 through 13, a handle 90 for installing and removing the test clip 10 with respect to an integrated circuit package 22 includes a pair of handle grips 91, 92 which are preferably connected by a resilient strap 93. The strap 93 facilitates manipulation of the handle 90 and, in particular, used thereof with respect to the test clip 10, for example be effecting the resilient biasing of the grips 91, 92 to the positions shown when not connected to a test clip. The strap 93 may be eliminated and the individual grips 91, 92 used without the strap, although such use would be more awkward than with the strap. The strap 93 may be secured to the grips 91, 92 by molding therewithin.

Each of the grips 91, 92 has a pair of elongate arms 93, 94 that support jaw-like portions 95, 96 at the ends thereof. Each jaw has a configuration providing for a slotted area 97 formed between a lower tooth 98 and an upper surface 99, and such jaws preferably are located only at respective opposite lateral ends of the grips 91, 92 (as is seen in FIG. 11). The jaws fit over the respective lateral edges 100, 101 (FIG. 3) of each body portion 11, 12 to grip the same securely. To that end the slots 97 preferably are approximately just slightly larger than the height of the respective upper bodies 16, 17 (FIG. 1), whereby the handle grips 91, 92 effectively become mechanical extensions of the body portions 11, 12 to form a close fit therewith. Since the jaws are at the lateral ends of the grips 91, 92, when such grips are placed on the body portions 11, 12, such jaws align substantially directly with the leaf springs 24, 25. Accordingly, as force is applied by the handles to the body portions tending to pivot, twist or rotate the same, thus resiliently distorting the leaf springs 24, 25, substantially direct force will be applied to such leaf springs while effecting a compression of the proximate parts of the body portions 11, 12 and minimizing other forces and stresses to such body portions, thereby maintaining the physical integrity of the test clip during such force application.

Using the handle 90 to install the test clip 10 on an integrated circuit package, the jaws 95, 96 are placed on the test clip in the manner illustrated in FIG. 13. Force is applied to the arms 93, 94 tending to move them toward each other to rotate or to pivot the body portions 11, 12 enlarging or opening the space between the teeth 21 of the opposed body portions. The space between opposed contacts 13 also is opened, and the test clip 10 may be inserted downward onto an integrated circuit package, for example in the manner illustrated in FIGS. 2 and 13. During such insertion or installation, the contacts 13 engage leads of the integrated circuit, preferably resiliently deform with respect to such leads, and wipe or rub against such leads to clean the interengaged surfaces and to enhance electrical connection. (Alternatively, the contacts may not be resiliently biased against the leads until the force applied to the handle arms 93, 94 is released.)

After such insertion or installation, the force applied to the arms 93, 94 tending to force the same together is released, whereupon the resilient connector mechanism 14 will tend to return the body portions 11, 12 back to original position closing the space between the teeth 21. The teeth 21 then preferably engage and grip the side wall of the integrated circuit package holding the test clip 10 thereto while the contacting portions 33 of the contacts 13 engage respective leads 31 of the integrated circuit package. After such installation, the handle 90 may be removed from the test clip 10. To remove the test clip 10 from an integrated circuit package, the handle may be re-connected to the test clip. Force applied to the arms 93, 94 tending to press the same toward each other effects the desired pivoting and space-opening effect of the body portion 11, 12 facilitating the freeing and removing of the test clip 10 from the integrated circuit.

In view of the foregoing, it will be appreciated that low profile test clip 10 of the invention may be used to connect the conductors of a cable to the leads of an integrated circuit package, for example, while such connection is easily maintained in a close-packed environment, the test clip having minimum space requirements, and the test clip also minimizes antenna effect.

We claim:

1. A handle for manipulating a low profile connector for integrated circuits and the like, said connector including a pair of electrically non-conductive support bodies mounted with respect to each other for relative pivoting-type movement, each support body carrying plural electrical contacts, with respect to such an integrated circuit or the like to place such contacts into or to remove such contacts from engagement with leads of such integrated circuit or the like, comprising:
   a pair of handle bodies, each including a gripping jaw means for gripping a respective support body to form a relatively rigid extension thereof and a force applying arm means for receiving force applied thereto to pivot respective pairs of gripping jaw means and support bodies with respect to the relative mounting of such support bodies; and
   resilient connecting means for connecting said handle bodies together while permitting coupling of said handle bodies to respective support bodies and relative pivotal movement of the latter in response to such force being applied to said arm means, said resilient coupling means being arranged to bias said gripping jaw means towards each other when coupled to respective support bodies, whereby force may be applied to said arm means to cause the support bodies to be pivoted to spread the electrical contacts thereof outwardly so that the support bodies can be placed over the integrated circuit and then pivoted to move the electrical contacts thereof inwardly towards the integrated circuit, said resilient connecting means yielding to such pivoting of the support bodies while continuing to bias said gripping jaw means towards each other.

2. A low profile clip connector for an electrical device that has plural rows of electrically conductive leads, comprising:
   a pair of clip bodies, each including a plurality of electrical contacts and an electronically non-conductive support;
   an electrical cable including a plurality of insulated electrical conductors;
   a plurality of said electrical contacts being electrically connected to respective electrical conductors at respective junctions thereof;
   said supports being molded to said cable and contacts to enclose said respective junctions while leaving respective contacting portions of said contacts exposed for connection to respective leads of such an electrical device; and
   coupling means for coupling said pair of clip bodies with respect to each other for relative movement away from each other to enable insertion of the electrical device therebetween and towards each other to engage the contacts to respective leads of the electrical device, said coupling means comprising a plurality of stacked leaf springs positioned at respective lateral ends of said bodies; and, in combination with said connector,
   a handle for manipulating said connector, said handle including a pair of handle bodies each including gripping jaw means for gripping a respective clip body to form a relatively rigid extension thereof and force applying arm means for receiving force applied thereto to pivot respective pairs of said gripping jaw means and clip bodies while distorting said leaf springs, said jaw means being positioned proximate lateral edges of said handle bodies for positioning in approximately aligned position with respect to said leaf springs when so engaged with said clip bodies.

3. A handle for manipulating a low profile connector for integrated circuits and the like, said connector including a pair of electrically non-conductive support bodies mounted with respect to each other for relative pivoting-type movement, each support body carrying plural electrical contacts and said support bodies having lateral ends extending beyond the width of an electrical cable extending between such support bodies, with respect to such an integrated circuit or the like to place such contacts into or to remove such contacts from engagement with leads of such integrated circuit or the like, comprising:
   a pair of handle bodies, each including gripping jaw means for gripping a respective support body to form a relatively rigid extension thereof and a force applying arm means for receiving force applied thereto to pivot respective pairs of the gripping jaw means and support bodies with respect to the relative mounting of the support bodies, said gripping jaw means being positioned on said handle bodies to grip such support bodies at the lateral ends thereof extending beyond the width of the cable; and
   connecting means for connecting said handle bodies together while permitting coupling of said handle bodies to respective support bodies and relative movement of the latter in response to such force being applied to said arm means.

4. A low profile clip connector for an electrical device that has plural rows of electrically conductive leads, comprising:
   an electrical cable including a plurality of insulated electrical conductors maintained in generally coplanar and parallel relationship;
   a pair of clip bodies each including an electrically non-conductive support for plural electrical contacts, said contacts being electrically connected at respective junctions to respective electrical conductors of said cable at insulation-removed portions thereof, said supports being molded to said cable and respective contacts to enclose the respective junctions while leaving respective contacting portions of said contacts exposed for connection to respective leads of the electrical device, and the electrical conductors electrically connected at respective junctions in one clip body extending in and between both said clip bodies in such generally coplanar and parallel relationship with the electrical conductors electrically connected at respective junctions in the other clip body; and
   coupling means for coupling said pair of clip bodies with respect to each other for relative movement away from each other to enable insertion of the electrical device therebetween and towards each other to engage the contacts to respective leads of the electrical device.

5. The connector of claim 4, wherein each of said electrical contacts further has a mounting portion that extends generally in parallel to the major axial direction of the respective conductor for electrical connection to the conductor at said mounting portion, and said supports each are molded to respective mounting portions of said contacts thereby to mount the contacts in the supports.

6. The connector of claim 5, wherein each of said bodies has curved wall surfaces for supporting respective contacts for bending relative thereto without overstressing of the contacts, and back-up wall surfaces limiting the maximum bending of respective contacts to prevent such overstressing.

7. The connector of claim 4, wherein said junctions comprise soldered connections of respective contacts and conductors of said cable.

8. The connector of claim 4, wherein each of said contacts has an end connecting portion for connection with a respective conductor of said cable offset from the contacting portion thereof, said end connecting portion being laterally offset relative to said contacting portion to facilitate close-packing of said contacts and connection thereof to isolated electrical conductors of said cable.

9. The connector of claim 4, wherein each of said contacts has a bent tab-like means for anchoring the same in the respective support molded thereabout.

10. The connector of claim 4, wherein respective junctions include a portion of respective electrical conductors deformed out of the major axial plane of said conductors to engage a respective electrical contact, and each of said contacts further has a connecting end portion connected to the deformed portion of the respective conductor.

11. The connector of claim 10, wherein said connecting end portion and said contacting portion of each contact are relatively offset to displace said connecting end portion relatively out of the major axial extent of said contacting portion to facilitate close-packing of said contacts relative to the conductors of said cable.

12. The connector of claim 11, wherein said connecting end portion is narrower than said contacting portion of each contact.

13. The connector of claim 10, further comprising common bus means across a plurality of said electrical conductors for connecting the same in common, said bus means being electrically connected to a plurality of said conductors that are not electrically connected to contacts.

14. The connector of claim 4, wherein said coupling means comprises at least one leaf spring.

15. The connector of claim 14, wherein stacked leaf springs are positioned at respective lateral ends of said bodies.

16. The connector of claim 15, wherein said leaf springs include holes for passage of molding material therethrough during molding of said bodies.

17. The connector of claim 4, in combination with another such clip connector at a respective different position along the length of said cable.

18. The connector of claim 4, wherein said supports have separator walls between respective pairs of contacts that separate said contacts and fit between respective adjacent leads of the electrical device.

19. The connector of claim 18, wherein the separator wall at the lateral ends of said supports have a lateral width exceeding the spacing between the intermediately disposed separator walls and the spacing between respective adjacent leads of the electrical device to preclude incorrect installation of the clip connector on the electrical device.

20. The connector of claim 4, wherein said supports have teeth for engaging side walls of the electrical device while said contacts resiliently electrically and mechanically engage leads of the electrical device.

21. The connector of claim 20, wherein said supports have separator walls between respective pairs of contacts that separate said contacts and fit between respective adjacent leads of the electrical device.

22. The connector of claim 21, wherein the separator walls at the lateral ends of said supports have a lateral width exceeding the spacing between the respective adjacent leads of the electrical device to preclude incorrect installation of the clip connector.

23. A low profile clip connector for an electrical device that has plural rows of electrically conductive leads, comprising:
an electrical cable having therein a planar arrangement of parallel electrical conductors;
a pair of clip bodies each one fixedly joined to said cable at respective locations along its length, each clip body including an electrically non-conductive support for electrical contacts electrically connected at respective junctions to respective conductors of said cable, and each contact having a contacting portion exposed for connection to a respective lead of the electrical device; and
resilient means for coupling said pair of clip bodies for relative pivotal movement substantially about an axis disposed essentially in or close to the plane of said planar arrangement of conductors, such pivotal movement enabling movement of the connecting portions of contacts in one body away from those in the other body to permit insertion of the electrical device therebetween and biased return movement to engage the connecting portions of the contacts to respective leads of the electrical device.

24. The connector of claim 23, wherein said contacts further have respective conductor connecting portions positioned in generally parallel relation with respective conductors, and said contacting portions of said electrical contacts extend angularly to the linear direction of said conductors and said conductor connecting portions to a direction generally parallel to the directional extent of a surface of a lead with which electrical connection is intended.

25. The connector of claim 24, wherein said conductor connecting portions of said electrical contacts and respective conductors form respective electrical and mechanical junctions, said respective conductors being deformed out of the major plane of the conductors to engage respective electrical contacts to form such junctions, said contacts each having a curved intermediate contact portion between said conductor connecting portion and contacting portion, and said supports having separator walls between respective pairs of adjacent contacts and further wall means between respective adjacent separator walls that permit bending of said electrical contacts during installation onto an electrical device while preventing overstressing of said contacts during such bending.

26. The connector of claim 23, said cable comprising flat ribbon cable having insulation removed to expose conductors at areas where said clip bodies are molded, respective junctions being formed between respective electrical contacts and conductors where the latter are so exposed, each of said junctions including a portion of the respective electrical conductor deformed out of the major axial plane of said conductor to engage a respective electrical contact mounting portion, and said contacting portions of said electrical contacts being positioned in said clip bodies in paired opposed parallel relation to each other for connecting with leads of a dual-in-line type lead configuration of an electrical device.

27. The connector of claim 23, wherein said resilient means comprises spring means for holding said clip bodies in a first relative relation and being resiliently yieldable upon application of force thereto to permit relative movement of said bodies to install or to remove the clip connector relative to an electrical device.

28. The connector of claim 27, wherein said bodies are molded to portions of said spring means to form a secure connection therebetween.

29. The connector of claim 27, wherein said cable comprises a generally planar cable portion that extends between said clip bodies, and said spring means is generally coplanar with respect to said cable portion.

30. The connector of claim 23, further comprising at least one additional pair of clip bodies, like said first-mentioned pair of clip bodies, molded to said cable and including therein a plurality of electrical contacts, and further resilient means for coupling said additional pair of clip bodies.

31. A low profile clip connector for an electrical device that has plural rows of electrically conductive leads, comprising:

a flat electrical cable including a plurality of substantially coplanar electrical conductors;

a pair of clip bodies each one fixedly joined to said flat cable at respective locations along its length, each clip body including an electrically non-conductive support for plural electrical contacts, and said contacts being electrically connected at respective junctions to respective electrical conductors of said cable; and coupling means substantially in or closely adjacent the plane of said flat cable for coupling said pair of clip bodies with respect to each other for relative movement away from each other to enable insertion of the electrical device therebetween and towards each other to engage the contacts to respective leads of the electrical device.

* * * * *